(12) United States Patent
Smith et al.

(10) Patent No.: US 6,518,662 B1
(45) Date of Patent: Feb. 11, 2003

(54) METHOD OF ASSEMBLING A SEMICONDUCTOR CHIP PACKAGE

(75) Inventors: John W. Smith, Palo Alto, CA (US); Joseph Fjelstad, Sunnyvale, CA (US)

(73) Assignee: Tessera, Inc., San Jose, CA (US)

( * ) Notice: Subject to any disclaimer, the term of this patent is extended or adjusted under 35 U.S.C. 154(b) by 252 days.

(21) Appl. No.: 09/713,527

(22) Filed: Nov. 15, 2000

Related U.S. Application Data

(63) Continuation of application No. 09/505,609, filed on Feb. 17, 2000, now Pat. No. 6,204,091, which is a continuation of application No. 08/984,933, filed on Dec. 4, 1997, now Pat. No. 6,130,116.
(60) Provisional application No. 60/032,871, filed on Dec. 13, 1996.

(51) Int. Cl.[7] .......................... H01L 23/34; H01L 23/48; H01L 21/50; H01L 21/44; H01L 21/48
(52) U.S. Cl. ........................ 257/724; 257/738; 257/778; 257/788; 257/790; 438/108; 438/112; 438/117; 438/124; 438/127; 438/613
(58) Field of Search .............................. 438/108, 112, 438/117, 124, 127, 613; 257/724, 738, 778, 788, 790

(56) References Cited

U.S. PATENT DOCUMENTS

| | | | |
|---|---|---|---|
| 5,148,265 A | 9/1992 | Khandros et al. | 357/80 |
| 5,148,266 A | 9/1992 | Khandros et al. | 357/80 |
| 5,390,844 A | 2/1995 | DiStefano et al. | 228/180.21 |
| 5,398,863 A | 3/1995 | Grube et al. | 228/106 |
| 5,491,302 A | 2/1996 | DiStefano et al. | 114/260 |
| 5,536,909 A | 7/1996 | DiStefano et al. | 174/261 |
| 5,659,952 A | 8/1997 | Kovac et al. | 257/778 |
| 5,661,086 A * | 8/1997 | Nakashima et al. | 257/668 |
| 5,663,106 A | 9/1997 | Karavakis et al. | 438/126 |
| 5,776,796 A | 7/1998 | DiStefano et al. | 438/126 |
| 5,844,315 A | 12/1998 | Melton et al. | 257/686 |
| 5,866,952 A | 2/1999 | Wojnarowski et al. | 257/788 |

* cited by examiner

*Primary Examiner*—David E. Graybill
(74) *Attorney, Agent, or Firm*—Lerner, David, Littenberg, Krumholz & Mentlik, LLP

(57) ABSTRACT

A method of encapsulating a microelectronic assembly comprises providing a microelectronic assembly having an element defining exterior surfaces and an array of terminals exposed at the exterior surfaces. The element defines an aperture through the exterior surfaces. A layer of a curable barrier material is screen printed onto a supporting element. The supporting element is assembled with the microelectronic assembly so that the layer of curable barrier material contacts the exterior surfaces and covers said one or more apertures. An encapsulant is applied to the microelectronic assembly.

35 Claims, 4 Drawing Sheets

METHOD OF ASSEMBLING A SEMICONDUCTOR CHIP PACKAGE

CROSS REFERENCE TO RELATED APPLICATIONS

This application is a continuation of U.S. patent application Ser. No. 09/505,609, filed Feb. 17, 2000, U.S. Pat. No. 6,204,091 which is in turn a continuation of U.S. patent application Ser. No. 08/984,933, filed Dec. 4, 1997, U.S. Pat. No. 6,130,116 the disclosures of which are hereby incorporated by reference herein. This application claims benefit of U.S. Provisional Application Ser. No. 60/032,871 filed Dec. 13, 1996, the disclosure of which is hereby incorporated by reference herein.

FIELD OF THE INVENTION

The present invention relates generally to a method of assembling a semiconductor chip package and specifically relates to a method of encapsulating a semiconductor chip package or an array of such semiconductor chip packages.

BACKGROUND OF THE INVENTION

A semiconductor chip is generally connected to an external circuit element through contacts on the front face of the chip. The contacts may be disposed in an area array, which substantially covers the entire front face of the chip, or in elongated rows extending parallel to and adjacent each edge of the chip. In certain embodiments, the contacts are connected to the external circuit element using flexible leads or wires. For example, in the tape automated bonding process (hereinafter referred to as the "TAB" process), a dielectric sheet, such as a thin foil of polyimide, is provided with one or more bonding windows and an array of metallic leads is provided on one surface of the dielectric sheet. Each lead extends outwardly from a central portion of the dielectric sheet towards one of the bond windows and has an outermost end projecting beyond the edge of the bond window. The dielectric sheet is juxtaposed with the chip so that the bond windows are aligned with the chip and so that the outermost ends of the leads will extend over the front, contact bearing face of the chip. The outermost ends of the leads are then bonded to the contacts of the chip, as by ultrasonic or thermocompression bonding. The inner ends of the leads are connected to external circuit elements, such as a printed circuit board, via conductive terminals.

Certain designs have reduced the stress on such electrical connections by redistributing the thermal cycling stress into a portion of the semiconductor chip package itself. An example of such a design is shown in commonly assigned U.S. Pat. Nos. 5,148,265 and 5,148,266, both disclosures of which are incorporated herein by reference. One disclosed embodiment of these patents shows the use of a chip carrier in combination with a resilient element to minimize problems associated with thermal cycling. Typically, the resilient element includes an elastomeric layer which, in the finished package, is disposed between the chip carrier and the contact bearing surface of the semiconductor chip. The resilient element provides resiliency to individual terminals on the chip carrier, allowing each terminal to move in relation to its electrically connected chip contact to accommodate for thermal cycling differences as necessary during testing, final assembly and operation of the device.

It has been determined that the use of an encapsulating material around the resilient element further reduces the stress on the electrical connections between the semiconductor chip and a chip carrier during operation of the chip and seals the elements of the chip package against corrosion. For example, copending, commonly assigned U.S. Pat. No. 5,659,952, the disclosure of which is incorporated herein by reference, discloses a method of fabricating a compliant interface for a semiconductor chip typically comprised of a compliant encapsulation layer having a controlled thickness. In certain preferred embodiments of the '952 patent, a first support structure, such as a flexible, substantially inextensible dielectric film, is provided. A resilient element, such as a plurality of compliant pads defining channels therebetween, is attached to a first surface of the first support structure. The compliant pad/support structure subassembly is then assembled with a second microelectronic element such as a semiconductor chip having a front face including a plurality of contacts. During assembly, the front face of the semiconductor chip is abutted against the compliant pads and the contacts are electrically connected to corresponding terminals on a second side of the dielectric film. An encapsulant material, such as a curable liquid elastomer, is then disposed between the semiconductor chip and the dielectric film and around the compliant pads while the chip and the dielectric film are held in place.

Other methods of encapsulating a microelectronic package are disclosed in commonly assigned U.S. patent application Ser. No. 08/726,697 filed Oct. 7, 1996, the disclosure of which is incorporated by reference herein. According to the '697 application, a semiconductor chip package assembly has a spacer layer between the top surface of a sheet-like substrate and the contact bearing surface of a semiconductor chip. The substrate has conductive leads thereon and the leads have first ends which are electrically connected to terminals on the substrate and second ends which are bonded to respective chip contacts. Typically, the spacer layer includes a compliant or elastomeric material. A protective layer is attached on a bottom surface of the substrate so as to cover the terminals on the substrate and to seal any apertures in the substrate. After the attachment of the protective layer, a flowable, curable encapsulant material is deposited around at least a portion of a periphery of the semiconductor chip so as to encapsulate the leads. The protective layer prevents the encapsulant from flowing through any substrate apertures. The encapsulant material is then cured or at least partially cured to allow for handling or further processing.

Commonly assigned U.S. patent application Ser. No. 08/532,235 filed Sep. 22, 1995, the disclosure of which is incorporated herein by reference, provides methods of encapsulating a plurality of microelectronic assemblies. Each microelectronic assembly includes a dielectric layer overlying a microelectronic element, such as a semiconductor chip, and having a top surface facing away from the microelectronic element. Each assembly also includes terminals on a top surface of the dielectric layer and flexible leads connecting the terminals to contacts on the microelectronic element. The assemblies are disposed side-by-side with one another so that the microelectronic elements are side-by-side and so that the dielectric layers are also disposed side-by-side in substantially co-planar relationship with one another. The dielectric layers of the various assemblies may be separate from one another and may define openings therebetween. The dielectric layers of the various subassemblies may further have openings through the dielectric layer. The disclosed method further includes the step of filling a curable liquid encapsulant between the dielectric layers and the microelectronic elements while substantially preventing flow of the encapsulant onto the top surfaces of the dielectric layers through the openings defined between and/or within the dielectric layers. In preferred embodiments, a top covering layer, such as a substantially imperforate layer, is applied over the top surfaces of the respective dielectric layers and occludes the openings between and/or within the dielectric layers. Thus, the top covering layer serves to prevent flow of the encapsulant onto the top surfaces during the encapsulating step. After the filling step, the encapsulant is preferably cured to a gel or a solid and most preferably to a compliant gel or solid. The top covering layer may then be removed. Alternatively, the top covering layer may remain as an integral part of the assembly. Preferably the step of providing the top covering layer includes the step of providing a solid layer and a layer of a soft sealant so that the sealant is disposed between the solid layer and the dielectric layers of the various assemblies. The sealant substantially encapsulates the terminals. The sealant may be an adhesive and may secure the solid layer to the assemblies.

Accordingly, a method of controlling the encapsulation process so that the terminals on an exterior surface of a semiconductor chip package are not contaminated is desirable. In addition, it would be desirable to provide a method of forming an efficacious compliant layer between the microelectronic elements.

SUMMARY OF THE INVENTION

One aspect of the present invention provides a method of making a microelectronic assembly. A method in accordance with this aspect of the invention includes providing one or more microelectronic assemblies having one or more elements defining exterior surfaces and an array of terminals exposed at the exterior surfaces, the one or more elements defining one or more apertures through the exterior surfaces. Typically, each microelectronic assembly includes a first element and a second element defining the exterior surface. In such a structure, the terminals are mounted on the second element of each assembly and are connected to the first element by flexible leads. The first element may include a semiconductor chip and the second element may comprise a flexible dielectric sheet including a polymeric material. In certain embodiments the apertures are bond windows extending through each of the second elements. In other embodiments, the one or more assemblies include a plurality of assemblies disposed side-by-side so that the spaces between the second elements of the assemblies define at least some of the apertures. In still further embodiments, the one or more microelectronic assemblies may include a unitary sheet including a plurality of the second elements and a plurality of the first elements mounted to the sheet. The method also includes providing a layer of a curable barrier material on a supporting element, the layer having openings therein in a pattern corresponding to the array of terminals on the one or more microelectronic assemblies. The curable barrier material may be provided by screen printing the barrier material on a surface of the supporting element, whereby the supporting element maintains the barrier material in a substantially planar configuration during an assembling step, as will be discussed in more detail below. The curable barrier material is preferably provided in an uncured ("wet") or partially cured ("B-stage cured") state and may include a dielectric material such as an elastomer or gel.

In the next stage of the process, the supporting element and the one or more microelectronic elements are assembled together so that the layer of barrier material contacts the exterior surfaces and covers the apertures and so that the openings in the layer of barrier material are aligned with the terminals. The barrier material is then cured while in contact with the exterior surface of the second microelectronic element to provide a barrier layer or coverlay which is adhered to the exterior surface of the second microelectronic element and which covers the apertures. After curing the barrier material step, the barrier material, hereinafter referred to as the "barrier layer," and the supporting element cooperatively surround the terminals so as to isolate the terminals from contaminants.

In the next stage of the process, a curable liquid encapsulant, such as a curable silicone elastomer, a flexibilized epoxy or a gel, is applied to or allowed to flow around each assembly. The barrier layer covers the apertures to prevent the curable liquid encapsulant from flowing through the apertures and contacting the exterior surface of the second microelectronic element and the terminals thereon. The curable encapsulant may comprise a curable silicone elastomer, a flexibilized epoxy and/or a gel. The encapsulant is then cured. Because the barrier layer is cured before the encapsulant is allowed to flow between the first and second elements, the encapsulant will not chemically interact with the barrier layer. It has been determined that the use of an uncured or partially cured barrier layer during the encapsulating step will generally impede proper curing of the encapsulant. This is because the materials present in the barrier layer tend to inhibit or "poison" the catalyst used to make the liquid encapsulant fully cross-link or cure.

Where each assembly includes first and second elements, the supporting element is maintained substantially parallel to the first microelectronic element after the assembly step and the barrier material is cured while the supporting element is maintained in a substantially parallel configuration. The supporting element maintains the second element or dielectric sheet in a generally planar configuration while it is in contact with the supporting element. The encapsulant is allowed to flow between the first and second elements to provide a compliant layer therebetween for each assembly.

Preferably, the encapsulation method is performed on a plurality of microelectronic assemblies, such as a plurality of semiconductor chip packages sharing a common frame. That is, the second elements are formed as portions of a common dielectric sheet. After encapsulating the semiconductor chip packages and after curing the encapsulant, the semiconductor chip packages may be separated or severed (diced) from the common frame at a predetermined distance from the periphery of each semiconductor chip. The dicing step may be performed so that the package is no larger than the contact bearing surface of the chip, or may be performed so that encapsulant bumpers are provided around the periphery of the individual chip. A member, such as a heat sink or a protective ring, may also be attached to the rear face of the semiconductor chip and/or to the bumpers to, inter alia, dissipate heat from the semiconductor chip package and enhance the package's structural integrity.

The method may also include the step of storing the one or more microelectronic assemblies after the curing the curable liquid encapsulant step, during which time the cured barrier layer and the supporting element cooperatively surround the terminals for protecting the terminals from contaminants. In this configuration, the supporting element remains attached to the barrier layer and overlies the terminals on the exterior surface for isolating and protecting the terminals from contaminants. When it is desirable to connect the one or more microelectronic assemblies to external circuit elements, the supporting element may be removed from the barrier layer so that the terminals on the exterior surface of the second microelectronic element are accessible through the openings in the barrier layer. The one or more microelectronic assemblies may then be electrically interconnected with external circuit elements by electrically connecting the terminals to conductive elements such as contact pads on the external elements. The terminals may be connected to the conductive elements using a conductive bonding material such as solder. Preferably, the supporting element is not removed from the barrier layer until less than 24 hours before the one or more assemblies are connected to an external circuit element and most preferably the supporting element is not removed until less than one hour before the assembly step.

The supporting element may comprise a fugitive material which is soluble in a liquid solvent such as water. As used herein, the term "fugitive material" means any material which can be removed by application of heat, radiation, ultraviolet light or chemical treatment without destruction of the microelectronic elements, the electrically conductive parts, or the compliant layer. Typically, the fugitive material includes a water soluble material, and may include a water soluble adhesive. In such instances, the dissolving step includes the step of chemically treating the fugitive material with a solvent such as water. The fugitive material may also be a relatively low-melting thermoplastic material or another material which will evaporate at a relatively low temperature. In other embodiments, the supporting element may be a flexible substrate which is peeled off of the barrier layer. A release treatment may be provided between the supporting element and the barrier layer so that the supporting element may be readily removed from the barrier layer without pulling the barrier layer from the exterior surface of the second microelectronic element.

In one preferred embodiment, the method of providing one or more microelectronic assemblies includes the steps of providing a first microelectronic element having a front face with electrical contacts and a second microelectronic element having a first surface and an exterior surface including terminals and flexible conductive leads connected thereto. The second microelectronic element includes bond windows for accessing the leads and the contacts. A resilient element may be provided between the microelectronic elements so that the resilient element is in contact with the front face of the first microelectronic element and the first surface of the second microelectronic element. The resilient element spaces the first and second microelectronic elements apart from one another and also provides a compliant layer therebetween. The resilient element may include a porous resilient layer such as a plurality of compliant pads defining channels therebetween. When the curable liquid encapsulant is applied to the one or more microelectronic assemblies, as described above, the curable liquid encapsulant flows in the channels so that after the curable liquid encapsulant is cured, the compliant pads and the curable liquid encapsulant provide a homogenous compliant layer between the first and second elements. Preferably the coefficients of thermal expansion for the pads and the curable liquid encapsulant are substantially similar in order to minimize the effects of thermal mismatch and thermal cycling. In other embodiments, the resilient element may be a continuous or unitary resilient layer disposed between the microelectronic elements. The resilient element typically includes a curable elastomer such as a curable silicone elastomer.

The present invention incorporates the realization that the manner in which a microelectronic assembly is assembled, encapsulated and stored may adversely affect the condition of the assembly when it is later electrically connected to an external circuit element. Thus, where a microelectronic assembly having external conductive terminals is assembled and then placed in storage for a prolonged period of time, and then assembled to an external circuit element having electrical contacts, difficulties can arise in bonding the terminals to electrical contacts on the external circuit element. It is generally accepted that these difficulties result from contamination of the conductive terminals during assembly and/or storage. These difficulties may occur if the liquid encapsulant, such as a liquid silicone elastomer, comes in contact with the terminals during assembly. For example where a curable liquid encapsulant incorporating silicone compounds is allowed to come in contact with conductive terminals, the presence of silicone on the terminals may impede or retard the formation of a strong bond between the terminals and contacts on the external element. To avoid these problems, the present invention provides a layer of a barrier material or "wet" barrier layer on the exterior surfaces of the second elements which covers the apertures and intimately surrounds portions of the flexible leads which overlie the exterior surfaces. Although the present invention is not limited by any theory of operation, it is believed that the "wet" barrier layer is better able to conform to the contour of the exterior surfaces because it is relatively pliable prior to being cured. As a result, gaps will not form around the sides of the leads between the barrier layer and the exterior surfaces as may occur when a preformed or fully cured barrier layer is applied to the exterior surfaces, as will be discussed in further detail below. After the "wet" barrier layer has been cured, the layer prevents the curable liquid encapsulant from flowing through the apertures and coming in contact with the terminals during the step of applying a curable liquid encapsulant. In addition, the protective layer and the supporting element cooperatively surround and protect the terminals to isolate the terminals from external contaminants.

The present invention also incorporates the realization that the formation of a compliant layer or compliant encapsulant may be impeded if the curable liquid encapsulant is improperly cured. This may occur when the encapsulant is cured while in contact with an uncured or partially cured barrier layer because the "wet" barrier layer will inhibit or "poison" the catalyst used to make the liquid encapsulant fully cross-link/cure. Accordingly, in preferred embodiments of the present invention, the liquid encapsulant is introduced only after the barrier material has been both attached to the exterior surfaces of the second elements and fully cured. Thus, since the barrier layer is fully cured prior to the introduction of the encapsulant, the barrier layer will not chemically interact with the encapsulant.

In other embodiments, a "wet" barrier layer is not utilized, but a pre-formed or fully cured barrier layer is used in conjunction with a supporting element to cover the apertures and/or bond windows and surround the perimeter of the terminals. Although, the use of a fully cured barrier layer does not take advantage of the pliable features described above for intimately surrounding the leads overlying the exterior surfaces, the fully cured barrier layer used in these embodiments still provides an effective method for isolating the terminals from contaminants and forming an efficacious compliant interface. A method of making a microelectronic assembly according to these embodiments includes providing one or more microelectronic assemblies having one or more elements defining exterior surfaces and an array of terminals exposed at the exterior surfaces, the one or more elements defining one or more apertures through the exterior surfaces. Next, a barrier layer is provided on the supporting element, the layer having first openings therein a pattern corresponding to the array of terminals on the one or more microelectronic assemblies. The barrier layer may include a flexible coverlay which confirms to the exterior surfaces. The supporting element may be substantially rigid or substantially flexible. Next, the supporting element and the one or more microelectronic assemblies are assembled together so that the barrier layer contacts the exterior surfaces and covers the apertures and so that the openings in the barrier layer are aligned with the terminals. After the assembling step, the terminals are aligned in the openings in the barrier layer and the supporting element overlies the terminals. A curable liquid encapsulant is then applied to the microelectronic assemblies to encapsulate the assemblies and the flexible leads. Here again, the barrier layer prevents the curable liquid encapsulant from flowing through the apertures. The curable liquid encapsulant is then cured. The barrier layer may also preferably have second openings which are aligned with the bond windows so that the coverlay material cannot inhibit cure of the encapsulant. The barrier layer and the supporting element cooperatively surround the terminals on the exterior surfaces in order to isolate the terminals from external contaminants, such as silicone or dust. The curable liquid encapsulant is then cured to provide a compliant layer between the one or more microelectronic assemblies and around the flexible leads. After the curing step, the assemblies may be placed in storage with the barrier layer and the supporting element in place. While the assembly is in storage, the barrier layer and the supporting element continue to isolate the terminals from contaminants. The assembly can later be removed from storage and connected to an external circuit element as described above in other embodiments. The supporting element also protects the terminals from contaminants when the assembly is being diced to provide individual microelectronic packages.

In other preferred embodiments, a microelectronic assembly includes one or more microelectronic assemblies having one or more elements defining exterior surfaces and an array of terminals exposed at the exterior surfaces, the one or more elements defining one or more apertures through the exterior surfaces. For example, each assembly may include a first microelectronic element having electrical contacts, a second microelectronic element having the terminals and flexible leads electrically interconnecting the terminals and the electrical contacts, whereby the second microelectronic element includes the apertures, and a compliant layer assembled between the first and second microelectronic elements and surrounding the flexible leads. The terminals are accessible at the exterior surface of the second microelectronic element and may be located on the exterior surface or accessible through openings in the exterior surface. The assembly further includes a barrier layer contacting the exterior surface of the second microelectronic element and covering the apertures. The barrier layer has openings therein which are in a pattern corresponding to the array of terminals exposed at the exterior surface. The openings are aligned with the terminals so that the terminals may be accessed through the openings. A supporting element overlies the terminals and the openings in the barrier layer. The barrier layer and the supporting element, which is removably secured to the barrier layer, cooperatively surround the terminals to isolate the terminals from contaminants. For example, in some embodiments the supporting element is a substantially flexible storage liner including a release liner which facilitates removal of the storage liner from the barrier layer. In other embodiments, the supporting element includes a fugitive material, such as a material dissolvable in water. An adhesive may be disposed between the barrier layer and the exterior surface. In certain preferred embodiments of the assembly, the first microelectronic element includes a semiconductor chip and the second microelectronic element includes a flexible dielectric sheet having a polymeric material. The assembly according to this embodiment may be stored and later assembled to an external circuit board according to the processes described above.

The foregoing and other objects and advantages of the present invention will be better understood from the following detailed description of preferred embodiments taken together with the attached drawings.

DETAILED DESCRIPTION OF PREFERRED EMBODIMENTS

Figure 1A:
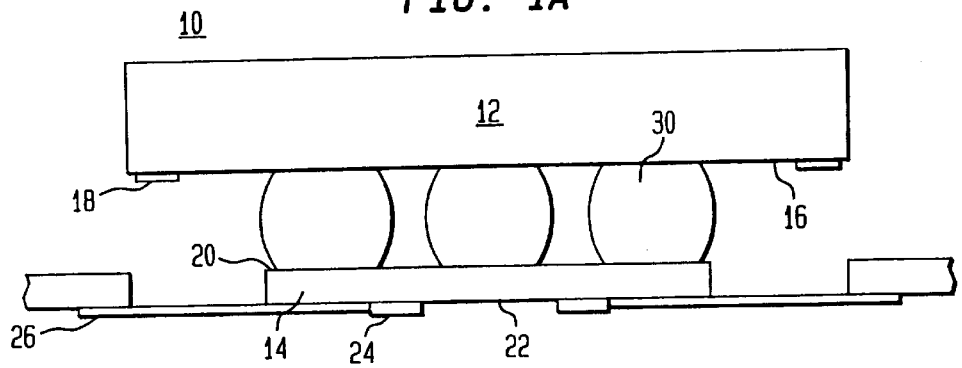
FIG. 1A shows a fragmentary side view of a first stage of a method of encapsulating a microelectronic assembly in accordance with one embodiment of the present invention.

Referring to FIGS. 1A–1G, a microelectronic assembly 10 includes first and second microelectronic elements 12 and 14. The first microelectronic element 12 is a semiconductor chip having a generally planar front face 16 including electrical parts or contacts 18 formed on peripheral regions of the front face 16. The contacts 18 are arranged in rows (not shown) which are adjacent, and run parallel to each edge of the chip 12. The contacts 18 in each row are spaced at very close intervals, typically about 100 to 250 micrometers center-to-center. This center-to-center spacing is adequate for high input/output ("I/O") count chips used with wire bonding or tape automated bonding systems.

The second microelectronic element includes a flexible, sheet-like dielectric film 14 having a first surface 20 and a second or exterior surface 22, and electrically conductive parts. The dielectric film 14 generally serves as a flexible connection component for the semiconductor chip 12 so that the semiconductor chip 12 can be effectively connected to an external circuit element, such as a printed circuit board. The sheet-like dielectric film 14 is preferably formed from a polymeric material, such as KAPTON™ (E) available from DuPont Chemical Corporation of an approximate thickness between 25 microns and 75 microns. The electrically conductive parts of the dielectric film include conductive terminals 24 on the exterior surface 22 of the dielectric film 14 and flexible leads 26 extending from the terminals 24 for electrically connecting the terminals 24 to the contacts 18 on the semiconductor chip 12. The dielectric film 14 includes bond windows 28 for accessing the leads 26 and contacts 18 while bonding the flexible leads 26 to the contacts 18 during a bonding operation. Although FIGS. 1A–1G show a fragmentary view of only a single assembly, the present invention may be used to simultaneously encapsulate a plurality of assemblies, as shown in FIG. 2.

Figure 1B:
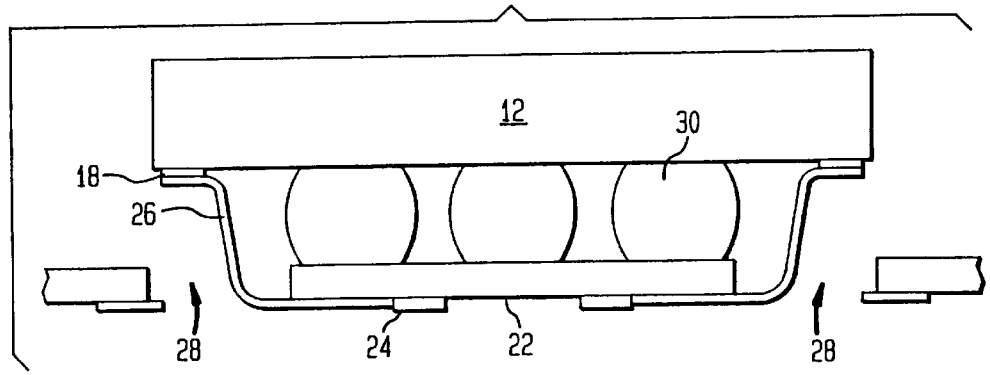
FIGS. 1B–1G show further stages of a method of encapsulating a microelectronic assembly.
Figure 2:
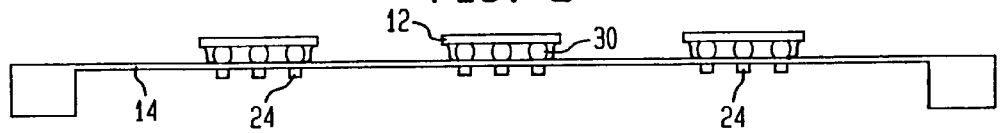
FIG. 2 shows a schematic side view of a microelectronic assembly including a plurality of assemblies according to embodiments of the present invention.

Referring to FIGS. 1A and 1B, in one preferred method for encapsulating a microelectronic assembly, a resilient element 30 is provided between the front face 16 of the semiconductor chip 12 and the first surface 20 of the dielectric film 14. The resilient element 30 is typically made of a curable liquid elastomer material, such as a silicone elastomer. One material currently being used as a silicone elastomer is DC 6810 manufactured by Dow Corning of Midland, Mich. The resilient element 30 may comprise a plurality of compliant pads formed in a mold or by using a stencil mask procedure as described in the '952 patent. In accordance with this procedure, a stencil mask (not shown) having a plurality of apertures therein is provided on the first surface 20 of the dielectric film 14 and a mass of a curable elastomer is wiped or screened across the first surface of the stencil so that the curable elastomer is deposited into the plurality of apertures in the stencil. The curable elastomer is then subjected to a curing process to cure the elastomer and provide the plurality of compliant pads 30. In certain embodiments, the array of compliant pads/dielectric film subassembly may be stored separately from the semiconductor chip until final assembly of a chip package by providing a storage liner over the top surface of the compliant pads 30 as disclosed in commonly assigned U.S. patent application Ser. No. 08/872,379, filed Jun. 10, 1997, the disclosure of which in incorporated by reference herein. The storage liner may then be removed when it is desirable to assemble the compliant pad/dielectric film subassembly with the semiconductor chip 12.

The resilient element/dielectric film subassembly is assembled to the chip 12 by abutting the resilient element 30 against the front face 16 of the semiconductor chip 12 so that the resilient element 30 is disposed between and in contact with the front face 16 of the semiconductor chip 12 and the first surface 20 of the dielectric film 14. An adhesive (not shown) may be provided at the front face so that the resilient element effectively adheres to the semiconductor chip. In this particular embodiment, while the resilient element is held in contact with the adhesive, the adhesive is subjected to a curing process to adhere the resilient element to the front face of the chip which in turn effectively assembles the dielectric film 14 to the semiconductor chip 12. One suitable adhesive is a solvent-free "snap-cure" adhesive sold under the trademark ABLEBOND 967-3, by the Ablestik Electronic Materials and Adhesives Company of Rancho Dominguez, Calif.

After the resilient element 30 has been adhered to the chip 12, each terminal 24 on the dielectric film 14 may be connected with an associated contact 18 on the chip 12 by inserting a bonding tool (not shown) into one of the bond windows 28 and bonding the flexible leads 26 to the contacts 18. The terminals 24 and flexible leads 26 may be formed from substantially any electrically conductive material, but preferably are formed from metallic materials such as copper and copper alloys, noble metals and noble metal alloys and are typically fabricated by conventional etching or deposition techniques. The flexible leads 26 are electrically connected to the contacts 18 on the semiconductor chip 12 by a conventional wire-bonding operation or by a bonding operation as shown in U.S. Pat. Nos. 5,398,863; 5,390,844; 5,536,909 and 5,491,302.

Figure 1C:
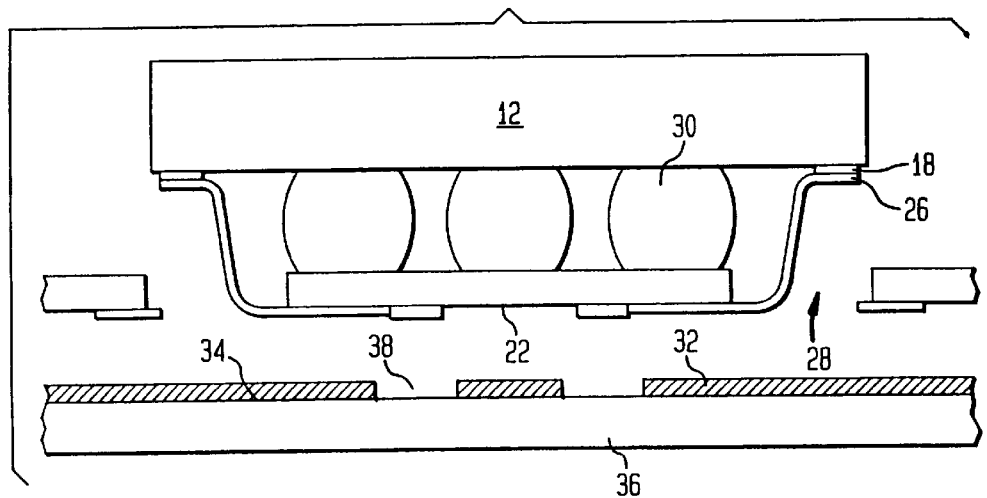
Figure 1D:
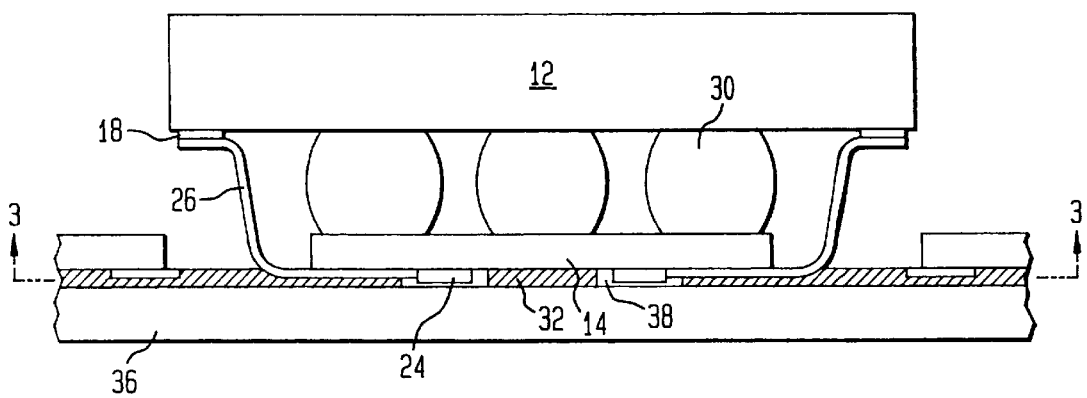
Figure 1E:
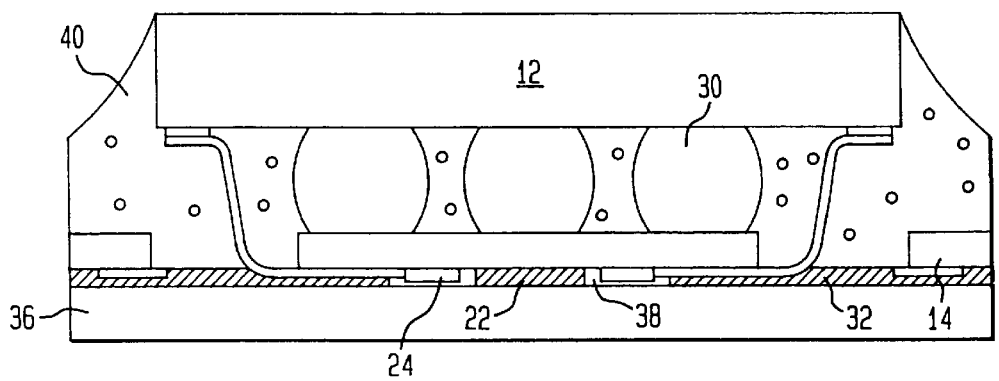
Figure 3:
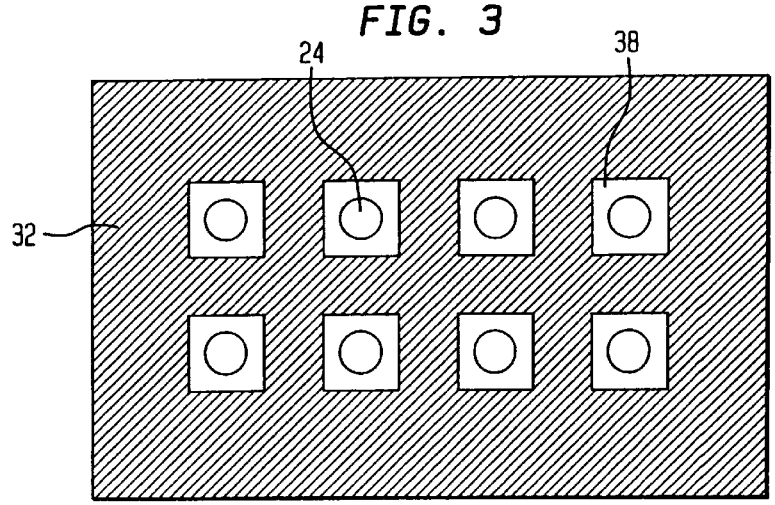
FIG. 3 shows a bottom view of the microelectronic assembly shown in FIG. 1D along sectional lines 2—2.

Referring to FIGS. 1C–1E, in the next stage of the process, the assembled and electrically interconnected microelectronic assembly is encapsulated and prepared for storage. Before the package is encapsulated, a layer of curable barrier material 32 is placed over the bond windows or apertures 28 in the dielectric film 14 so the encapsulant does not flow through the apertures 28 during an encapsulating step, as will be described in more detail below. The layer of curable barrier material 32 is formed by first depositing a curable dielectric material on the first surface 34 of a supporting element 36. In preferred embodiments, the curable barrier material 32 includes a screen-printable, photo-imageable coverlay such as that manufactured and sold by Cotes Circuit Products, Ltd. of Bath, England under the UV600 Series trademark. The supporting element 36 may comprise a partially rigid substrate or may comprise a flexible film such as the flouropolymer release film sold under the trademark TEDLAR by DuPont of Wilmington, Del. The release film is preferably transparent or translucent to a curing wavelength so that the barrier material may be cured with the release film in place. Generally, a stencil (not shown) having one or more apertures therein is placed on the first surface 34 of the supporting element 36. The curable barrier material 32 is then deposited or screen printed through the apertures to provide the barrier material 32 on top of the supporting element 36, the barrier material 32 having one or more openings 38 therein. The openings 38 in the barrier material 32 are arranged in a pattern which corresponds to the array of terminals 24. The barrier material 32 is preferably partially cured ("B-stage cured") or uncured ("wet") when it is initially provided on the first surface 34 of the supporting element 36. Referring to FIGS. 1C–1D, in the next stage of the operation, the supporting element 36 including the barrier material is juxtaposed with and abutted against the exterior surface 22 of the dielectric film 14 so that the barrier material 32 is in contact with the exterior surface 22 and covers the apertures 28. During the abutting step, the openings in the barrier material 36 are aligned with the terminals 24 so that the terminals 24 remain accessible once the barrier material 36 is in contact with the exterior surface 22. FIG. 3 is a bottom view of the assembly (along sectional line 2—2 in FIG. 1D) showing the alignment of the terminals 24 within the openings 38 in the layer of barrier material 36 after the abutting step.

During the abutting step the supporting element 36 is maintained in a position which is substantially parallel to the front face 16 of the semiconductor chip 12. This ensures that the dielectric film 14 and the barrier material 32 are substantially parallel to the front face 16 of the semiconductor chip 12. The supporting element 36 overlies the openings 38 in the barrier material 32 including the terminals 24 aligned in the openings 38. While the supporting element 36, including the barrier material 32, is abutted against the exterior surface 22 of the dielectric film 14, the barrier material 32 is subjected to a curing process to provide a cured barrier layer 32 adhering to the exterior surface 22 of the dielectric film 14. As discussed above, after the barrier material has been cured it is hereafter referred to as a "barrier layer." The barrier layer 32 is substantially flexible and intimately conforms to the contour of the exterior surface 22 of the dielectric film 14.

Figure 4:
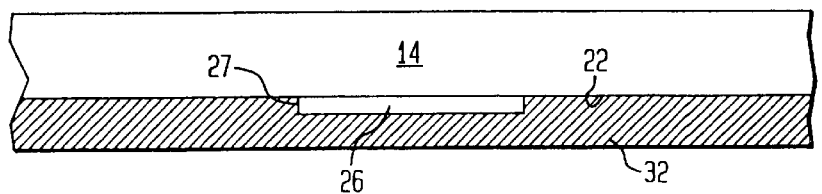
FIG. 4 shows a fragmentary cross-sectional view of the assembly shown in FIG. 1D.

Referring to FIG. 4, because the barrier layer 32 is applied to the exterior surface 22 when uncured, "wet" or B-stage cured, the barrier layer is substantially flowable or pliable so that it intimately surrounds the sides 27 of the flexible leads 26 overlying the exterior surface 22. The barrier layer in FIG. 4 is in intimate contact with the sides 27 of the lead 26 because the barrier material flows around the lead 26 before the barrier material 32 is fully cured.

Referring to FIG. 1E, after the barrier layer 32 has been provided in contact with the exterior surface 22 of the dielectric film 14, curable liquid encapsulant 40 is applied to the assembly whereby the encapsulant 40 is allowed to flow between the semiconductor chip 12 and the dielectric film 14 and around the leads 26. Certain preferred encapsulation methods are disclosed in commonly assigned U.S. patent application Ser. No. 08/726,697 filed Oct. 7, 1996, the disclosure of which is incorporated herein by reference. The barrier layer 32 covers the apertures 28 to prevent the liquid encapsulant 40 from flowing through the apertures 28 and contacting the terminals 24. The liquid encapsulant 40 is then cured by energy such as heat, ultraviolet light or other radiant energy to form, in conjunction with the array of compliant pads 30, a substantially homogenous, planar, compliant layer between the chip 12 and the dielectric film 14. Because the barrier layer 32 covers the apertures or bond windows 28 during the encapsulating step, there is no risk that the liquid encapsulant 40 will contact the exterior surface 22 of the dielectric film 14 or the terminals 24 thereon. Moreover, because the barrier layer 32 was fully cured prior to the introduction of the liquid encapsulant 40, the encapsulant 32 will not chemically interact with the material present in the barrier layer 32 which could inhibit the encapsulant from fully curing, as described above.

A microelectronic assembly encapsulated in accordance with the processes described above may be stored and/or shipped in the stage shown in FIG. 1E, which shows a diced or severed package. The barrier layer 36 and the supporting element 36 are left in place during storage to cooperatively surround the terminals 24 for isolating and protecting the terminals 24 from external contaminants, such as silicone or dust. It may be preferable to dice or sever the individual assemblies with the supporting element in place so that dust generated by the dicing step does not contaminate the terminals 24.

Figure 1F:
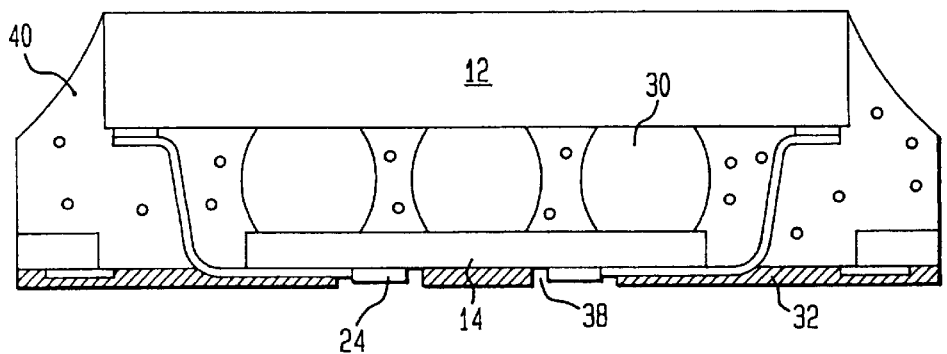
Figure 1G:
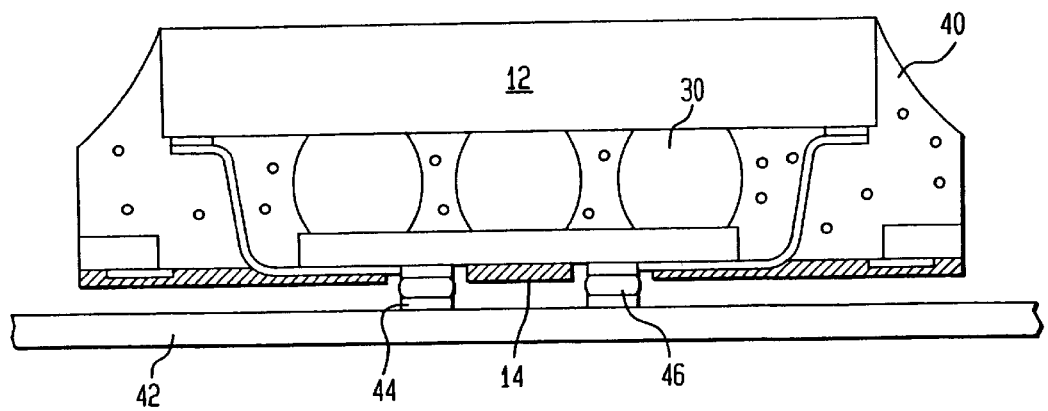

Referring to FIGS. 1F and 1G, when it is desirable to remove the semiconductor chip package from storage and electrically connect the package to an external circuit element 42, the supporting element 36 is removed from the barrier layer 32 so that the terminals 24 on the exterior surface 22 of the dielectric film 14 are exposed and accessible through the openings 38 in the barrier layer 32. In certain embodiments, the supporting element 36 comprises a fugitive material and may be removed from the package by dissolving the supporting element 36 in a liquid solution. In one preferred embodiment, the supporting element 36 is a material which is soluble in water so that the supporting element 36 may be removed by exposing it to water. In other embodiments the supporting element 36 may include a flexible storage or release liner which is peeled from the barrier layer 32. A release treatment (not shown), such as TEFLON® may be provided between the storage liner 36 and the barrier layer 32 so that the liner 32 may be removed without pulling the barrier layer 32 from the exterior surface 22 of the dielectric film 14. Generally, the supporting element 36 is removed shortly before the semiconductor chip package is connected to the external circuit element 42. Preferably, the supporting element 36 is removed less than 24 hours before the electrically connecting step and most preferably less than one hour before the electrically connecting step. This minimizes the likelihood that the terminals 24 will become contaminated prior to being assembled to the external circuit element 42. Once the supporting element 36 has been removed to expose the terminals 24 at the exterior surface 22 of the dielectric film 14, the semiconductor chip package is electrically interconnected with the external circuit element 42, such as by bonding the terminals 24 to electrical contacts or contact pads 44 on the external circuit element 42. The terminals 24 may be bonded to the contact pads 44 using a flowable conductive material 46 such as solder.

In other embodiments of the claimed invention, one or more microelectronic assemblies such as those described above, are encapsulated. The barrier layer in these embodiments is pre-formed and/or cured before being provided on the supporting element. The barrier layer in this embodiment is substantially similar to that shown in FIG. 1C in that it has first openings therein in a pattern corresponding to the array of terminals. The barrier layer is preferably made of a photo-sensitive dielectric polymer material such as DuPont PYRALUX PC 1025 and is typically adhesively attached to the exterior surface such as by using a vacuum lamination technique or an adhesive, so that the apertures are covered to protect the terminals during an encapsulating step, as described above. When the barrier layer is assembled with the exterior surface, the terminals are aligned with the first openings in the barrier layer and a curable liquid encapsulant is allowed to flow between the first and second elements and around the flexible lead as described above. In other preferred embodiments, the barrier layer may also have second openings (not shown) which are aligned with the bond windows so that the barrier layer cannot inhibit cure of the encapsulant. During storage, the barrier layer and the supporting element cooperatively surround the terminals to isolate the terminals and protect the terminals from external contaminants. The assembly may be later removed from storage and connected to an external circuit element, as described above.

Figure 5:
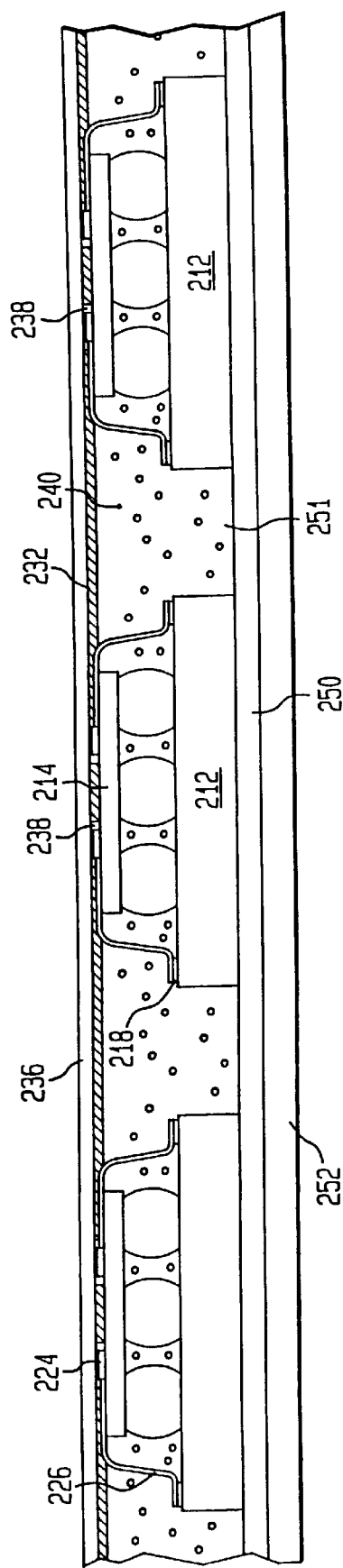
FIG. 5 shows a fragmentary cross-sectional view of a method of encapsulating a plurality of microelectronic assemblies according to further embodiments of the present invention.

Referring to FIG. 5, a further embodiment of the present invention provides for simultaneously encapsulating a plurality of assemblies which are disposed side-by-side. In accordance with this embodiment a plurality of microelectronic elements 212, such as semiconductor chips, are disposed side-by-side on a backing element or bottom covering layer 250, which in turn is disposed on a support surface 252, such as the support surface of a bottom fixture element as disclosed in commonly assigned U.S. patent application Ser. No. 08/532,235 filed Sep. 22, 1995, the disclosure of which is incorporated herein by reference. The bottom covering layer 250 preferably is an adhesive tape adapted to adhere to the bottom surfaces of the semiconductor chips 212. The adhesive tape 250 may also adhere to the support surface 252. The semiconductor chips 212 are disposed side-by-side next to one another and define openings therebetween which are sealed by the bottom covering layer 252. Each individual assembly also includes a second element 214, such as a dielectric layer, defining an exterior surface of the assembly and extending over the front face or contact bearing surface 216 of the semiconductor chip 212. Each dielectric layer 214 bears a plurality of terminals 224 on the exterior surface which are connected to contacts 218 on the semiconductor chip 212 by flexible leads 226. Similar to the semiconductor chips 212, the dielectric layers 214 are disposed side-by-side with one another and are substantially co-planar with one another. The side-by-side dielectric layers have spaces therebetween which define apertures. In certain embodiments, the individual dielectric layers may include additional openings defining further apertures. Each dielectric layer is supported above the front face of the semiconductor chip by a resilient element, such as the compliant pads described in copending commonly assigned U.S. patent application Ser. No. 08/366,236, the disclosure of which is hereby incorporated by reference.

A supporting element 236 including a layer of a curable barrier material 232 having openings 238 therein in a pattern corresponding to the array of terminals 224 on the dielectric layers 214 is provided over the array of microelectronic assemblies 210. The supporting element 236 is applied with the layer of a curable barrier material side facing the dielectric layers 214 so that the layer of barrier material 232 contacts the exterior surfaces of the dielectric layers 214 and covers the apertures between the assemblies and in the dielectric layers and so that the openings 238 in the layer of barrier material 232 are aligned with the terminals 224. The supporting element 236 and the layer of a curable barrier material 232 extend outwardly in horizontal directions beyond the plurality of microelectronic assemblies 210. Next the layer of curable barrier material 232 is cured while being maintained in contact with the exterior surfaces of the dielectric layers 214 to thereby form a barrier layer 232 covering the apertures between the side-by-side dielectric layers, as well as the apertures in the respective dielectric layers.

After the layer of curable barrier material has been cured to provide the barrier layer 232, a curable liquid encapsulant 240 is applied to the plurality of microelectronic assemblies 210, whereby the barrier layer 232 prevents the curable liquid encapsulant 240 from flowing through the apertures between the side-by-side dielectric layers and the apertures in the dielectric layers. The encapsulated assemblies may then be cured and placed in storage as described above. While the assemblies are in storage, the barrier layer 232 and the supporting element 236 cooperatively surround the terminals 224 for protecting the terminals from contaminants. The plurality of microelectronic assemblies may be stored together in a side-by-side configuration or may be severed from one another (singulated) prior to storage. The encapsulated assemblies may later be electrically interconnected to an external circuit element by removing the supporting element from the barrier layer 232 so that the terminals 224 on the dielectric layer 214 are accessible through the openings 238 in the barrier layer 232. Preferably the supporting element 236 is not removed until less than 24 hours before the electrically connecting step and most preferably until less than one hour before the connecting step.

In a further embodiment, the barrier layer is fully cured before being placed in contact with the side-by-side dielectric layers. In still further embodiments, all of the semiconductor chips may be formed as a continuous element or wafer, without gaps or apertures therebetween so that a bottom covering layer is not required. In such an arrangement, the barrier layer overlies the apertures in the dielectric layers and any apertures in the respective dielectric layers.

As will be readily appreciated, numerous variations and combinations of the features discussed above may be utilized. For example, it is contemplated that the present invention may be utilized in conjunction with any electrical element having electrically conductive parts on an external surface thereof in order to protect the conductive parts. In addition, the above-identified processes may incorporate connection components as disclosed in copending, commonly assigned U.S. Provisional Patent Application Ser. No. 60/033,067, the disclosure of which is incorporated herein by reference. The connection component disclosed in the No. 60/033,067 application includes a bus having an inner edge which projects into the bond window. During an encapsulating step, the encapsulant wets to the inner edge of the bus to provide a void-free compliant interface for a semiconductor chip package. As these and numerous other variations and combinations of the features discussed above may be employed without departing from the present invention, the foregoing description of the preferred embodiments should be taken by way of illustration, rather than by way of limitation, of the features discussed above.

We claim:

1. A method of encapsulating a microelectronic assembly comprising:

providing one or more microelectronic assemblies having one or more elements defining exterior surfaces and an array of terminals exposed at the exterior surfaces, said one or more elements defining one or more apertures through the exterior surfaces;

screen printing a layer of a curable barrier material on a surface of a supporting element, said layer of curable barrier material having openings therein in a pattern corresponding to the array of terminals on said one or more microelectronic assemblies;

assembling the supporting element and said one or more microelectronic assemblies so that the layer of curable barrier material contacts the exterior surfaces and covers said one or more apertures and so that the openings in the layer of curable barrier material are aligned with the terminals; and applying an encapsulant to said one or more microelectronic assemblies.

2. The method of claim 1, further comprising:

after the assembling step, curing the curable barrier material while maintaining the curable barrier material in contact with the exterior surfaces to thereby form a barrier layer covering said one or more apertures.

3. The method of claim 2, wherein the maintaining step includes maintaining the curable barrier material in contact with the supporting element.

4. The method of claim 2, wherein the barrier layer prevents the encapsulant from flowing through said one or more apertures.

5. The method of claim 1, further comprising curing the encapsulant.

6. The method of claim 2, further comprising curing the encapsulant.

7. The method of claim 6, further comprising:

after the step of curing the encapsulant, storing said one or more microelectronic assemblies during which the barrier layer and the supporting element cooperatively surround the terminals and protect the terminals from contaminants.

8. The method of claim 7 further comprising:

after the storing step, removing the supporting element from the barrier layer so that the terminals are accessible through the openings in the barrier layer.

9. The method of claim 8 further comprising:

electrically connecting the terminals to conductive elements on an external circuit element so that said one or more microelectronic assemblies are interconnected with the external circuit element.

10. The method of claim 8, wherein the removing step occurs less than 24 hours before the electrically connecting step.

11. The method of claim 8, wherein the removing step includes dissolving the supporting element in a solvent.

12. The method of claim 11, wherein the solvent includes water.

13. The method of claim 8, wherein the removing step includes peeling the supporting element off of the barrier layer.

14. The method of claim 1, wherein the curable barrier material and the encapsulant are the same material.

15. The method of claim 1, wherein the supporting element maintains the curable barrier material in a planar configuration prior to the assembling step.

16. The method of claim 1, wherein the supporting element includes a release treatment so that the level of adhesion between the curable barrier material and the supporting element is lower than the level of adhesion between the curable barrier material and the exterior surfaces.

17. The method of claim 2, wherein the step of curing the curable barrier material includes curing the curable barrier material to an elastomer or a gel.

18. The method of claim 2, wherein the barrier layer does not inhibit the curing of the encapsulant.

19. The method of claim 1, wherein the curable barrier material is a liquid curable barrier material.

20. The method of claim 1, wherein the encapsulant is a curable liquid encapsulant.

21. A method of encapsulating a microelectronic assembly comprising:
  providing one or more microelectronic assemblies having one or more elements defining exterior surfaces and an array of terminals exposed at the exterior surfaces, said one or more elements defining one or more apertures through the exterior surfaces;
  screen printing a layer of a curable barrier material on a surface of a supporting element, said layer of curable barrier material having openings therein in a pattern corresponding to the array of terminals on said one or more microelectronic assemblies;
  curing the curable barrier material while maintaining the curable barrier material in contact with the exterior surfaces to thereby form a barrier layer covering said one or more apertures;
  assembling the supporting element and said one or more microelectronic assemblies so that the barrier layer contacts the exterior surfaces and covers said one or more apertures and so that the openings in the barrier layer are aligned with the terminals; and
  applying an encapsulant to said one or more microelectronic assemblies.

22. The method of claim 21, wherein the maintaining step includes maintaining the curable barrier material in contact with the supporting element.

23. The method of claim 21, wherein the barrier layer prevents the encapsulant from flowing through said one or more apertures.

24. The method of claim 21, further comprising curing the encapsulant.

25. The method of claim 21, further comprising:
  after the step of curing the encapsulant, storing said one or more microelectronic assemblies during which the barrier layer and the supporting element cooperatively surround the terminals and protect the terminals from contaminants.

26. The method of claim 25, further comprising:
  after the storing step, removing the supporting element from the barrier layer so that the terminals are accessible through the openings in the barrier layer.

27. The method of claim 26, further comprising:
  electrically connecting the terminals to conductive elements on an external circuit element so that said one or more microelectronic assemblies are interconnected with the external circuit element.

28. The method of claim 26, wherein the removing step occurs less than 24 hours before the electrically connecting step.

29. The method of claim 26, wherein the removing step includes dissolving the supporting element in a solvent.

30. The method of claim 29, wherein the solvent includes water.

31. The method of claim 26, wherein the removing step includes peeling the supporting element off of the barrier layer.

32. The method of claim 21, further comprising:
  before the assembling step, providing an adhesive between the barrier layer and the exterior surfaces.

33. The method of claim 21, wherein the barrier layer does not inhibit the curing of the encapsulant.

34. The method of claim 21, wherein the curable barrier material is a liquid curable barrier material.

35. The method of claim 21, wherein the encapsulant is a curable liquid encapsulant.

* * * * *